(12) United States Patent  (10) Patent No.: US 7,663,222 B2
Lohninger et al. (45) Date of Patent: Feb. 16, 2010

| | | | |
|---|---|---|---|
| (54) | SEMICONDUCTOR DEVICE AND METHOD FOR PRODUCING SAME | | |
| (75) | Inventors: | Gerhard Lohninger, Munich (DE); Ulrich Krumbein, Rosenheim (DE) | |
| (73) | Assignee: | Infineon Technologies AG, Munich (DE) | |
| ( * ) | Notice: | Subject to any disclaimer, the term of this patent is extended or adjusted under 35 U.S.C. 154(b) by 461 days. | |
| (21) | Appl. No.: | 11/342,294 | |
| (22) | Filed: | Jan. 27, 2006 | |
| (65) | | Prior Publication Data | |
| | US 2006/0197187 A1 | Sep. 7, 2006 | |
| (30) | Foreign Application Priority Data | | |
| Jan. 28, 2005 | (DE) | ................ 10 2005 004 160 | |
| (51) | Int. Cl. *H01L 23/48* (2006.01) | | |
| (52) | U.S. Cl. ................ 257/696; 257/779; 257/684 | | |
| (58) | Field of Classification Search .......... 257/735, 257/779, 777 See application file for complete search history. | | |
| (56) | References Cited | | |

U.S. PATENT DOCUMENTS

| | | | | |
|---|---|---|---|---|
| 5,512,774 | A * | 4/1996 | Nakagawa et al. ........... 257/501 |
| 5,835,988 | A * | 11/1998 | Ishii ........................ 257/684 |
| 6,002,163 | A | 12/1999 | Wojnarowski |
| 6,121,119 | A | 9/2000 | Richards et al. |
| 6,201,707 | B1 * | 3/2001 | Sota ........................ 361/761 |
| 6,358,772 | B2 * | 3/2002 | Miyoshi .................... 438/106 |
| 2004/0115920 | A1 * | 6/2004 | Yamazaki et al. ........... 438/613 |
| 2004/0203237 | A1 | 10/2004 | Laffoley |
| 2005/0121795 | A1 | 6/2005 | Mauder |

FOREIGN PATENT DOCUMENTS

| | | |
|---|---|---|
| DE | 101 07 142 A1 | 11/2002 |
| DE | 103 51 028 A1 | 6/2005 |
| WO | WO 03/073505 A1 | 9/2003 |

OTHER PUBLICATIONS

"ShellBGA Process Flow." *Xintec*. www.xintec.com.tw/ShellBGAEng/ShellBGA%20Process%20Flow.htm.

* cited by examiner

*Primary Examiner*—Leonardo Andújar
(74) *Attorney, Agent, or Firm*—Maginot, Moore & Beck

(57) ABSTRACT

The semiconductor device includes a semiconductor body having a first and an opposite second main surface and side faces connecting the main surfaces, a circuit region in the semiconductor body adjacent to the first main surface, having a circuit contact terminal, a metallization region extending from the circuit contact terminal on the first main surface onto a side face of the semiconductor body to provide an exposed contacting region on the side face of the semiconductor body, and an insulation layer arranged between the metallization region and the semiconductor body, the insulation layer having an opening for electrically connecting the circuit contact terminal to the metallization region.

18 Claims, 9 Drawing Sheets

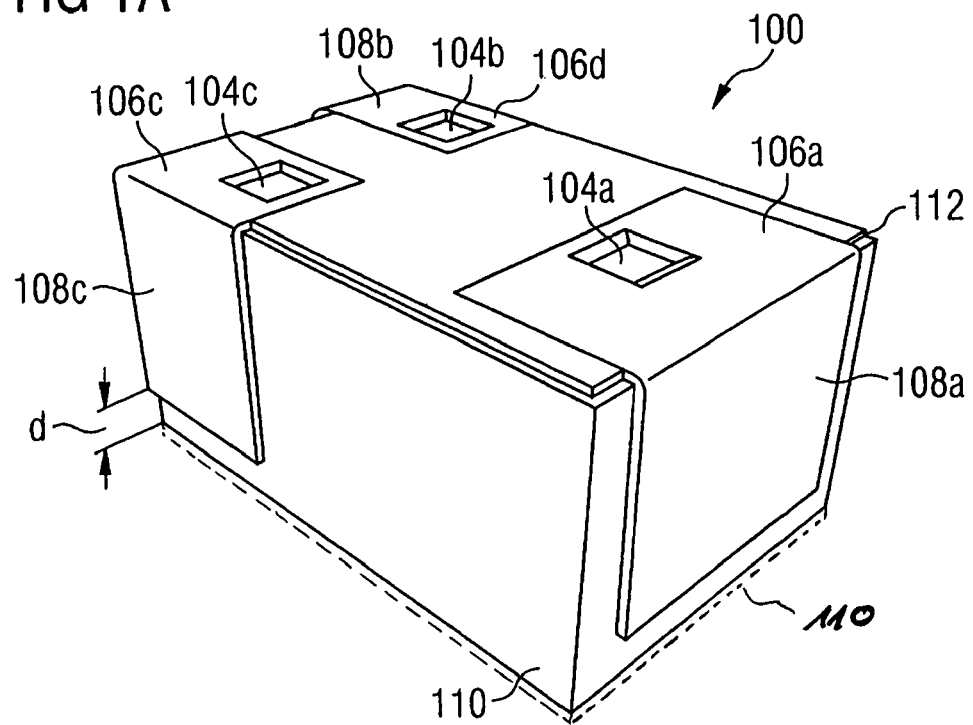
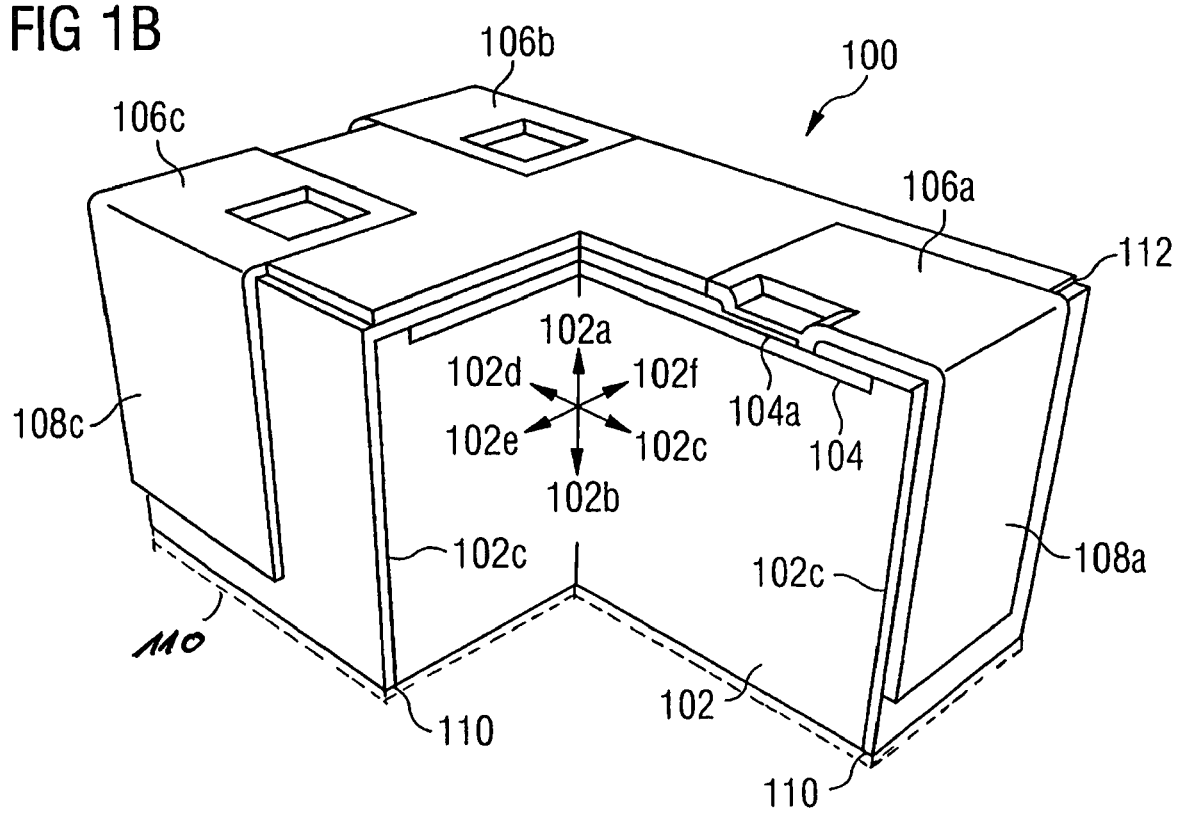

SEMICONDUCTOR DEVICE AND METHOD FOR PRODUCING SAME

CROSS-REFERENCE TO RELATED APPLICATION

This application claims priority from German Patent Application No. 10 2005 004 160.4, which was filed on Jan. 28, 2005, and is incorporated herein by reference in its entirety.

BACKGROUND OF THE INVENTION

1. Field of the Invention

The present invention relates to semiconductor devices and the manufacturing methods thereof and, in particular, to an area-saving accommodation of a semiconductor device in a package and to a semiconductor device which may be deposited onto a circuit board, for example by means of solder, in an area-saving way, wherein the present invention may particularly be applied to a novel standardized model for discrete elements such as, for example, diodes, transistors, switches and filters, but also to more complex integrated circuit assemblies.

2. Description of Related Art

The forms of packages presently used for single semiconductor elements or semiconductor devices may generally be divided into two groups, namely wired package types and package types having solder bumps. According to the first group of package forms for semiconductor devices above indicated, discrete semiconductor devices are presently mainly produced and offered in so-called SMD packages (SMD=surface mounted device). With this form of package, a semiconductor chip is applied or mounted to a metallic support (lead) or lead frame, wherein so-called bond wires (connecting wires) connect the contact pads (semiconductor contacts) of the semiconductor chip to the metallic support or lead frame. Thus, supports or lead frames in the application are connected to the associated conductive traces on the circuit board by means of solder in an electrically and/or thermally conducting way. The backside contact of the semiconductor chip here may also form an electrical and/or thermal contact to the lead frame. After connecting the semiconductor chip to the lead frame, the system is potted and thus closed by a sealing mass (mould). The metallic supports here are all on one side of the resulting package (such as, for example, TSLP models) or are led out from the package or the sealing mass laterally in a flat or bended manner (such as, for example, TSFP and SOT models).

The second group of models for semiconductor device packages are so-called WLP device packages (WLP=wafer level package) or CSP device packages (CSP=chip size package). In this second group of package forms, metallic solder bumps are deposited onto the pads or contacts of the semiconductor chip and subsequently provided with a semiconductor passivation, i.e. an insulation or protective material. Semiconductor devices of this kind having a WLP or CSP package are then connected to the conductive traces or contact pads to the conductive traces of the application boards by means of a flip chip process such that the solder bumps then make electrical contact in the application from the semiconductor device to the conductive traces of the circuit board.

Regarding these WLP and CSP package forms for semiconductor devices, reference is, for example, made to a manufacturing process flow for producing a shell BGA package form by Shellcase-Wafer Level Packaging, which is, for example, published over the following internet link (http://www.xintec.com.tw/product/ShellBGA_Process-_Flow_New %200422'04.pdf).

It should be kept in mind with the above-mentioned manufacturing process of "Shellcase" that in the manufacturing methods for WLP package forms having BGA structures (BGA=ball grid array) illustrated, metallic connections are provided between the contact pads of a semiconductor chip and the solder bumps on the top face of the semiconductor device to allow re-wiring of the connecting lines in this way.

Regarding the solder bumps for WLP and CSP package forms described above, it should generally be kept in mind that, caused by manufacturing and the requirements of the mounting process on the application board, they have a minimum size and a minimum distance to one another, which has the result that the resulting semiconductor chip, i.e. the semiconductor chip accommodated in a WLP or CSP package, must be considerably larger than the active area of the semiconductor device, such as, for example, the active area of a diode or a transistor.

It has been observed from the above explanations that an essential problem of conventional package models for semiconductor devices is that the resulting total size of the semiconductor device accommodated in the package is considerably larger than the active area on the semiconductor chip, wherein this becomes particularly evident in small-signal transistors and diodes where the contact pads and the unused areas therebetween which remain empty due to the minimum distance of the contact areas account for a considerable portion of the total device area. High-frequency diodes or high-frequency transistors and the semiconductor chips thereof, for example, have lengths and widths in the order of magnitude of 0.2 mm to 0.4 mm and a height of about 0.1 mm. When these semiconductor chips are accommodated in the wired packages mentioned above, the smallest package forms available at present comprise dimensions in the order of magnitude of half a millimeter (0.5 mm) per side length.

In order to obtain these dimensions in the order of magnitude indicated, the height of a conventional semiconductor chip is particularly reduced to a value of 0.1 mm in order to achieve a final resulting height of less than half a millimeter, including the bond wires required and the sealing mass. Additionally, it should be kept in mind that the solder bumps used in CSP and WLP package forms have a diameter in the order of magnitude of 0.4 mm so that relatively large chip dimensions are required for the single semiconductor device.

Regarding the package designs or package forms for semiconductor devices known from the prior art, problems result in that these package forms require a considerably larger area than the dimensions of the active regions of the single semiconductor would require. Furthermore, the standardized models for semiconductor devices discussed above comprise a relatively large height due to the accommodation in a package, this being extremely critical dimensions in particular in modules consisting of a plurality of semiconductor devices. Additionally, it should be noted that assembling the semiconductor chip (i.e. accommodating the single semiconductor chips in a package), which is to a great extent determined by material costs, is frequently the most expensive part of manufacturing the single semiconductor product.

Regarding the assembling costs for semiconductor devices, it should also be kept in mind that, with a present 6-inch semiconductor wafer for example, there are about 100,000 to 200,000 single elements on the semiconductor wafer so that accommodating the diced semiconductor chip in one of the package forms described above in single chip processes in semiconductor device manufacturing is a very complicated and thus expensive matter.

Also, it should be noted with regard to the WLP and CSP package forms discussed above that they operate with metallic solder bumps which, however, show quality deficiencies with temperature cycling and generally only have a very poor thermal conductivity. These solder bumps can only provide a limited thermal contact so that problems of semiconductor devices having these packages forms, particularly with regard to temperature cycling resistance, frequently cannot be avoided.

This results from CSP or WLP semiconductor devices to be connected to the circuit board via the metallic bumps such that thermal differences between the semiconductor device and the circuit board may only be compensated via the solder connections. Because the solder bumps, however, have a relatively poor thermal conductivity, this may, when operating the semiconductor device which is thermally heated due to the dissipation, result in a temperature difference between the circuit board and the semiconductor device, which is frequently compensated for via the metallic solder bumps in a relatively insufficient way. This may also result in mechanical tension between the circuit board and the semiconductor device such that the quality deficiencies may result with regard to WLP or CSP semiconductor devices with temperature cycling mentioned above.

Regarding the TSLP package forms and the flip chip package forms having bumps known from the prior art, which presently are the smallest models for semiconductor devices, it should be kept in mind that after building these semiconductor devices into the application, the electrical contacts of these semiconductor devices can no longer be subjected to an optical inspection after being soldered in the application circuit, since in these package forms the contact (solder contact) with the conductive traces of the application circuit is covered by the package and the semiconductor device.

SUMMARY OF THE INVENTION

Departing from this prior art, it is an object of the present invention to provide an improved concept for providing semiconductor devices having reduced dimensions, wherein additionally the manufacturing costs for providing standardized semiconductor devices may be decreased considerably.

In accordance with a first aspect, the present invention provides a semiconductor device having: a semiconductor body having a first and an opposite second main surface and side faces connecting the main surfaces, a circuit region in the semiconductor body adjacent to the first main surface, having a circuit contact terminal, a metallization region extending from the circuit contact terminal on the first main surface onto a side face of the semiconductor body to provide an exposed contacting region on the side face of the semiconductor body, and an insulation layer arranged between the metallization region and the semiconductor body, the insulation layer having an opening for electrically connecting the circuit contact terminal to the metallization region.

In accordance with a second aspect, the present invention provides a semiconductor circuit assembly having: a semiconductor device, and a circuit board having a contact pad, wherein the semiconductor device has a semiconductor body having a first and an opposite second main surface and side faces connecting the main surfaces, a circuit region in the semiconductor body adjacent to the first main surface, having at least one circuit contact terminal, a metallization region extending from the circuit contact terminal on the first main surface onto a side face of the semiconductor body to provide an exposed contacting region on the side face of the semiconductor body, and an insulation layer arranged between the metallization region and the semiconductor body, wherein the insulation region has an opening for electrically connecting the circuit contact terminal to the metallization region, and wherein the exposed metallization region on the side face of the semiconductor device is connected to the contact pad of the circuit board by means of electrical connecting means and preferably solder.

In accordance with a third aspect, the present invention provides a method for manufacturing a semiconductor device having an exposed metallization region arranged on a side face of the semiconductor device, having the steps of: providing a semiconductor wafer having a main surface, a plurality of circuit regions being arranged in the semiconductor wafer adjacent to the main surface, and a circuit region having a circuit contact terminal, producing a trench in the main surface of the semiconductor wafer adjacent to the circuit region, producing an insulation layer on the circuit region and at least partially in the trench, the circuit contact terminal remaining exposed, producing a metallization region on the insulation layer and the circuit contact terminal so that the metallization region is connected to the circuit contact terminal and the metallization region extends from the circuit contact terminal of the circuit region at least partially into the adjacent trench, and dicing the semiconductor wafer to obtain a plurality of diced semiconductor devices having the exposed metallization region arranged on one of the side faces of the semiconductor device.

At least some embodiments of the present invention are based on the finding that, on the one hand, a suitable standardized model for extremely small semiconductor devices and a corresponding advantageous manufacturing method for a resulting semiconductor device having considerably reduced dimensions may be achieved by guiding, in the semiconductor device, a metallic area or several metallic areas form the active main surface of the semiconductor chip, i.e. from the contact pads of the semiconductor chip on the active front side or active back side of the semiconductor chip arranged there, onto one or several side faces of the semiconductor chip and by mainly making the electrical and/or thermal contact to the application circuit, i.e., for example, to the circuit board, there.

Inventively, this is achieved by the fact that this metallization area guided to the side face is exposed on the side face of the semiconductor chip and thus may form the contact areas of the semiconductor device for an electrical and/or thermal connection thereof to the outside, wherein these metallic contact areas are electrically isolated from this semiconductor material of the semiconductor chip only by an insulation layer assembly, i.e. an insulation layer or a layer stack of several insulation layers, on the semiconductor material of the semiconductor chip. It is noted that at least some embodiments may employ an insulation layer that is comprised of several partially or fully disconnected regions, but which are disposed between the metallization regions and the semiconductor material.

According to the inventive concept for producing semiconductor devices, the different production steps for obtaining the inventive single semiconductor devices may essentially be completely performed on the wafer level with relatively uncomplicated semiconductor production steps, wherein the complete single semiconductor devices having the contact areas exposed at the side faces of the semiconductor chip may already be obtained after the final dicing of the single semiconductor chips on the wafer level.

The inventive concept for manufacturing semiconductor devices and the single semiconductor devices obtained by the inventive manufacturing method comprise a number of advantages over semiconductor chips accommodated in a conventional package known from the prior art.

The advantages of embodiments of the present invention can be, for example, very pronounced in single semiconductor devices, in particular in high-frequency single semiconductor devices, where the non-active areas, like the contact pads and unused areas, frequently account for a considerable portion of the chip area. Thus, the example of a high-frequency diode or a high-frequency transistor is a suitable point of departure to illustrate the advantages of the present invention over the prior art.

At present, semiconductor chips the lengths and widths of which are in the order of magnitude of 0.2 mm to 0.4 mm and the heights of which are in a range of 0.1 mm are manufactured by means of conventional semiconductor wafer processing and semiconductor dicing steps.

According to the present package forms for semiconductor chips illustrated above with regard to the prior art, additions are required for the wired packages to obtain the resulting completed semiconductor device so that the smallest, with regard to the dimensions, packages available at present comprise dimensions in an order of magnitude of at least half a millimeter per side face (length, width and height).

Compared to the wired package forms known in the prior art, the inventive concept is characterized by the fact that it is not necessary to grind the semiconductor chips obtained by the different semiconductor wafer processing processes to a considerably thinner size than the final device thickness which according to the present invention thus basically represents the resulting package height or device height.

When, for example, a height for the semiconductor device of 0.4 mm is required, the semiconductor slice (wafer), according to the present invention, need not be thinned to about 0.1 mm or less, as is case in the wired packages according to the prior art, to provide a sufficient margin for the lead frame, bond wires and the sealing mass. In particular, it should be kept in mind that this semiconductor wafer thinning to thicknesses of 0.1 mm or less required according to the prior art and further handling of the semiconductor wafers require a considerably higher technical expenditure than is possible with wafer thicknesses of the semiconductor wafer to be processed in the range of 0.3 mm to 0.4 mm according to the present invention so that the entire wafer processing and wafer handling may be simplified considerably.

On the other hand, it is thus possible according to the inventive concept to provide heights for the resulting semiconductor devices which cannot be realized for wired packages according to the present prior art. Thus, it is particularly to be noted that small heights around 0.1 mm, as may be achieved according to the inventive concept, prove to be of extraordinary advantage in circuit modules for mobile consumer devices, such as, for example, mobile telephones, only mentioning one of a plurality of application examples.

Another advantage of the inventive semiconductor devices and the manufacturing method thereof is a reduced device area compared to semiconductor devices known from the prior art. In wired package forms and also in package forms having solder bumps, such as, for example, CSP and WLP package forms, according to the prior art, the final model of the semiconductor device, in particular for single semiconductors and high-frequency single semiconductors, is significantly larger than the active area of the semiconductor circuits on the semiconductor chip due to the accommodation in the package forms illustrated in the prior art. In particular for semiconductor elements of this kind, the present inventive semiconductor devices are characterized by the fact that the resulting semiconductor device having the semiconductor chip need not be designed to be considerably larger than the active area of the semiconductor circuit arranged on the semiconductor chip. This reduced size of the resulting semiconductor device is a considerable advantage, in particular for elements for mobile consumer products.

Additionally, an improved thermal contact between the semiconductor device and the application (circuit board) and thus an improved reliability of a resulting circuit assembly or circuit module may be obtained for semiconductor devices and manufacturing thereof according to the inventive concept.

The inventive concept in contrast offers the advantage that the inventive semiconductor devices may make use of the side faces unused in the package forms according to the prior art for a thermal and/or electrical contact. Furthermore, it should be obvious that the basically even contact areas of the inventive semiconductor devices are also considerably more reliable with regard to thermal and/or electrical cycling tests.

Another advantage of the inventive semiconductor devices and the manufacturing methods thereof is that in the inventive semiconductor devices, the semiconductor device at the side faces of which the contact areas to the outside are arranged, may be placed in the prepared soldering positions, such as, for example, on a circuit board, such that the solder may "wick up" the side faces of the semiconductor device. Thus, according to the present invention, the electrical and/or thermal contacts may be viewed on the side faces of the inventive semiconductor devices and may thus be subjected to an optical final test for inspecting the contact positions after being built into the application.

Another advantage of the inventive concept for manufacturing novel semiconductor devices is that this manufacturing method may be performed on the wafer level as a so-called full-wafer process, i.e. the realization of the inventive semiconductor devices may essentially be completely performed during the semiconductor wafer processing steps, i.e. no single chip processors are necessary for accommodating same in a package, as has been the case in the prior art. When presently a number of, for example, about 100,000 to 200,000 semiconductor chips per semiconductor wafer (for example for a 6-inch semiconductor wafer) are assumed, it is obvious that extremely extensive simplifications result when manufacturing the inventive semiconductor devices since according to the present invention the essentially completed single semiconductor devices are already present after dicing the semiconductor wafer.

BRIEF DESCRIPTION OF THE DRAWINGS

Preferred embodiments of the present invention will be detailed subsequently referring to the appended drawings, in which:

FIGS. 1a-1b show an exemplary design of an inventive CSP semiconductor device (single transistor) according to a first embodiment of the present invention;

DESCRIPTION OF PREFERRED EMBODIMENTS

Figure 2:
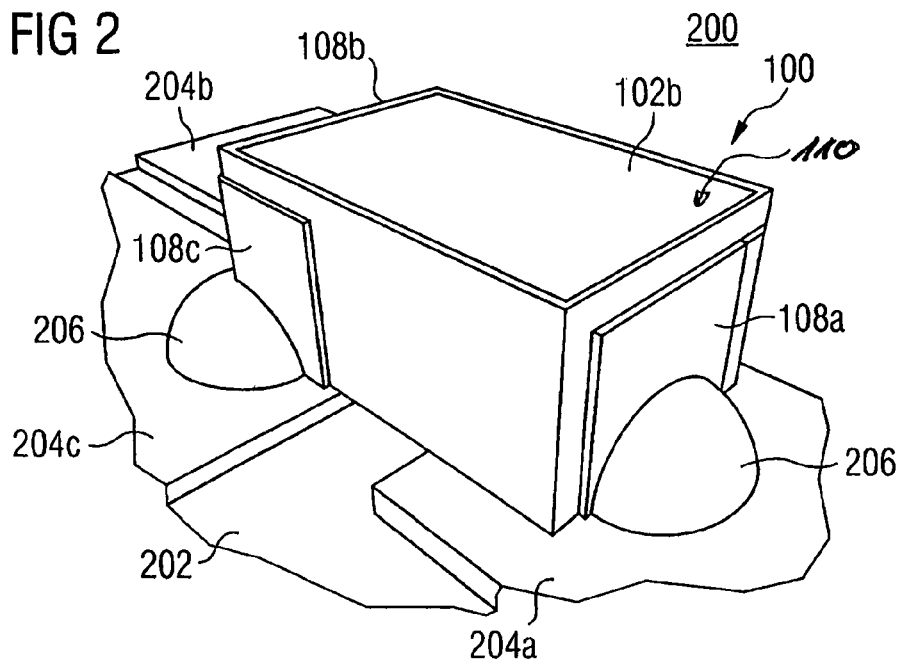
FIG. 2 shows a semiconductor circuit assembly made of a circuit board having contact pads and a semiconductor device electrically and/or thermally connected to the circuit board according to the present invention.

Subsequently, a preferred embodiment of an inventive CSP semiconductor device 100 (CSP=chip size package) is exemplarily described for a single bipolar transistor referring to FIGS. 1a-1b, wherein a 3-dimensional complete illustration of the inventive CSP semiconductor device 100 is shown in FIG. 1a and a 3-dimensional sectional illustration of the inventive CSP semiconductor device 100 where one quadrant is open to explain the setup, is shown in FIG. 1b. In connection with the present invention, it is, however, to be clear that the inventive concept may basically be applied to all semiconductor chip assemblies possible which basically comprise any number of contact pads for an external contacting, preferably to a circuit board, wherein for illustrating the inventive concept the inventive semiconductor devices and manufacturing thereof are subsequently only exemplarily illustrated using a single bipolar transistor having three external terminals.

As is illustrated in FIGS. 1a-1b, the inventive CSP semiconductor device 100 comprises a semiconductor chip 102 having a first main surface 102a, a second main surface 102b and four side faces 102c, 102d, 102e, 102f connecting the two main surfaces 102a, 102b to each other. In the present embodiment having the single bipolar transistor, an active circuit region 104 is arranged in the semiconductor body 102 adjacent to the first main surface 102a. As is illustrated in FIGS. 1a-1b, the active circuit region 104 having the single bipolar transistor comprises three circuit contact terminals 104a, 104b and 104c as a collector terminal, an emitter terminal and a base terminal. The CSP semiconductor device 100 illustrated in FIGS. 1a-1b additionally comprises three metallization regions 106a, 106b and 106c, wherein the first metallization region 106a is associated to the first circuit contact terminal 104a (collector terminal), the second metallization region 106b is associated to the second circuit contact terminal 104b (emitter terminal) and the third metallization region 106c is associated to the third circuit contact terminal 104c (base terminal).

As is illustrated in FIGS. 1a-1b, the first metallization region 106a extends from the first circuit contact terminal 104a, i.e. from the collector terminal, on the first main surface 102a of the semiconductor chip 102 onto the first side face 102c of the semiconductor chip body 102, wherein the second metallization region 106b extends from the second circuit contact terminal 104b (emitter terminal) on the first main surface 102a of the semiconductor body 102 onto the side faces 102d and 102f of the semiconductor body 102. The third metallization region 106c extends from the third circuit contact terminal 104c (base terminal) on the first main surface 102a of the semiconductor body 102 onto the side faces 102d and 102e of the semiconductor body 102. Thus, these metallization regions 106a-106c adjacent to the side faces 102c to 102f of the semiconductor body 102 form first, second and third exposed contacting regions 108a, 108b and 108c of the CSP semiconductor device according to the present invention.

As is also illustrated in FIGS. 1a-1b, an insulation layer 110 is arranged at least between the metallization regions 106a, 106b, 106c and the semiconductor body 102, wherein the insulation layer 110 comprises at least one through opening each for electrically connecting the first circuit contact terminal 104a to the metallization region 106a, the second circuit contact terminal 104b to the second metallization region 106b and the third circuit contact terminal 104c to the third metallization region 106c. As is exemplarily illustrated in FIGS. 1a-1b, the insulation layer 110 may exemplarily cover the first main surface 102a and the side faces 102c-102f of the semiconductor device 100 basically completely. Optionally, another insulation layer or protective layer 112 may be provided which is exemplarily arranged above the insulation layer 110 on the first main surface 102a of the semiconductor device 100 between the metallization regions 106a-106c and terminates in a flush manner with the metallization regions 106a-106c, as is shown in FIGS. 1a-1b.

As further illustrated in FIGS. 1a-b, an optional insulation layer 110 may be applied to the second main surface 102b of the semiconductor device 100, which is illustrated by way of example as a dashed line in FIGS. 1a-b. The optional insulation layer 110 is preferably arranged to cover the exposed semiconductor regions on the second main surface 102b of the semiconductor body 102, so that the second main surface 102b is at least partially and preferably completely covered. This optionally applied insulation layer 110 may thus form a backside passivation of the semiconductor device 100 as a protection against environmental influences.

It should be noted regarding the setup illustrated in FIGS. 1a-1b of an inventive CSP semiconductor device for a single bipolar transistor that the inventive principle for a CSP device may also be applied to any other semiconductor element basically having any number of circuit contact terminals, as will be illustrated in greater detail below.

As is illustrated in the inventive CSP semiconductor device illustrated in FIGS. 1a-1b, the metallization regions 106a-106c extend from the first main surface 102a of the semiconductor chip body 102 over two respective side faces 102d and 102f and 102d and 102e basically completely to the second main surface 102b of the semiconductor chip body 102. It should, however, be obvious with regard to the present invention that the respective metallization regions 106a, 106b and 106c may, however, also only extend partly over the respective side faces 102c-102f to the second main surface 102b, wherein a distance d of the metallization regions 106a-106c on the side faces 102c-102f of the semiconductor chip body 102 to the second main surface 102b thereof may be adjusted. Furthermore, the metallization areas 106a, 106b and 106c may also be embodied such that they extend onto only one side face or several adjacent side faces 102c-102f of the semiconductor chip body 102. Furthermore, the metallization regions 106a, 106b and/or 106c may also extend onto the second main surface 102b of the semiconductor chip body, wherein in these cases, too, an insulation layer (such as, for example, a dielectric) 110 is always arranged between the metallization regions and the semiconductor material of the semiconductor chip body 102.

The different designs of the metallization regions 106a-106c illustrated above may each refer to only one of the metallization regions 106a-106c or several or all metallization regions, so that each metallization region 106a-106c may, for example, comprise a different form, wherein it must only be kept in mind that, when a plurality of metallization regions are used, they extend onto at least one side face of the semiconductor chip body 102 and provide an exposed contacting region there.

The single metallization regions 106a-106c may, regarding the final specific design, take any combination of the possible designs indicated above.

Referring to the inventive CSP semiconductor device illustrated in FIGS. 1a-1b, it is also to be noted that, for example, the insulation layer 110 extends continuously from the first main surface 102a of the semiconductor chip body 102 onto at least one of the side faces 102c-102f of the semiconductor chip body 102, to electrically isolate the at least one metallization region 106a-106c from the semiconductor material of the semiconductor chip body 102. Furthermore, the insulation layer 110 may optionally also be disposed on the second main surface 102b of the semiconductor chip body 102. It is also to be kept in mind that the insulation layer 110 illustrated in FIGS. 1a to 1b may comprise a plurality of single insulation layers to form a so-called insulation layer stack. The respective thickness of the insulation layer 110 or of the insulation layer stack is designed to provide, when operating the semiconductor device depending on the voltage or current provisions at the external exposed contacting regions 108a-108c, a sufficient electrical breakdown resistance between the metallization regions 106a-106c and the semiconductor material of the semiconductor chip body 102 arranged below.

A possible realization of the insulation layer 110 or the insulation layer stack could, according to the present invention, be to provide a layer of a nitride material (such as, for example, Si3N4) having a thickness in a range of about 300 nm to 1000 nm and preferably in a range around about 600 nm. Alternatively, a layer stack of an oxide material having a thickness in a range from 300 nm to 1000 nm and preferably in a range around about 550 nm and of a nitride material (such as, for example, Si3N4) having a thickness in a range of 150 nm to 450 nm and preferably in a range around about 300 nm may be provided.

Optionally, a layer of an imide material having a thickness of 5 μm to 15 μm and preferably 10 μm or a layer of an BCB material (benzocyclobutene) having a thickness of 1 μm to 15 μm and preferably 5 μm may additionally be provided on the insulation layer 110 or the insulation layer stack.

Additionally, it should be kept in mind that the metallization regions 106a-106c, too, could consist of a plurality of conducting layers and consist of a conducting layer stack to allow the smallest possible contact resistance for an external contacting of the inventive CSP semiconductor device 100.

The insulation layer 110 optionally disposed on the second surface 102b preferably acts as a backside passivation for the semiconductor device 100 as a protection against environmental influences. The insulation layer 110 additionally applied to the second main surface 102b may advantageously protect the second main surface 102d (backside) of the inventive CSP semiconductor device 100 particularly when it is mounted to a circuit board, for example by means of solder. Thus, particularly short circuits between the solder material and the semiconductor material on the backside 102b of the semiconductor device 100 may be avoided.

A possible realization of a layer stack for the metallization regions 106a-106c could, according to the invention, be to provide a layer of an Al material (Al=aluminum) having a thickness of 0.1 μm to 3 μm and preferably 0.5 μm as a "seed layer" (metallic seed layer) and a layer of an Ni material (Ni=nickel) having a thickness of 10 μm to 50 μm and preferably 20 μm comprising an Au deposit or capping (Au=gold) having a thickness of preferably a few atomic layers which is deposited onto the Ni material.

It is also illustrated in FIGS. 1a-1b that the inventive CSP semiconductor device comprises a semiconductor body 102 of a continuous semiconductor material, wherein it should, however, of course become evident with regard to the present invention that different semiconductor layer structures are possible for the semiconductor body 102 and in particular for the active and/or passive single semiconductor elements arranged in the active circuit region 104, wherein in the simplest case the circuit region 104 in the semiconductor chip body 102 is an active or passive single semiconductor element, or may also comprise an integrated circuit having a plurality of active and/or passive semiconductor elements.

FIG. 2 exemplarily illustrates how the exemplary inventive CSP semiconductor device illustrated in FIGS. 1a-1b forms a semiconductor circuit assembly 200, wherein an assembly where the CSP semiconductor device 100 is arranged on a circuit board 202 having contact pads 204a-204c is referred to as a semiconductor circuit assembly, wherein the exposed metallization regions 108a-108c at the side faces of the semiconductor device 100 are connected to the contact pads 202a to 202c of the circuit board 200 by means of electrical connecting means and preferably solder 206. Referring to the circuit assembly illustrated in FIG. 2, it should also be kept in mind that the inventive CSP semiconductor device 100 exemplarily rests as even as possible on the circuit board 200 with regard to the first main surface 102a of the semiconductor body 102.

Preferably, the first main surface 102a of the semiconductor body 102 of the CSP semiconductor device 100 faces the application, i.e. the circuit board 202. Then, the solder 206 deposited in the application not only wets the exposed contact areas or metallization regions 108a-108c at the side faces of the semiconductor device 100, but also the metallization regions on the first main surface 102a of the semiconductor device 100. It should, however, also be noted that in the case that the metallization regions 108a-108c also extend to the second main surface 102b or onto the second main surface 102b of the semiconductor device 102, the second main surface 102b of the semiconductor body 102 of the CSP semiconductor device 100 may face the application, i.e. the circuit board 202, and the exposed metallization regions 108a-108c at the side faces of the semiconductor device may be connected to the contact pads 202a-202c of the circuit board 200 by means of electrical connecting means 206.

With regard to the semiconductor circuit assembly 200 illustrated in FIG. 2, it should be kept in mind that when manufacturing the inventive CSP semiconductor device 100 (as will be discussed subsequently) after thinning the semiconductor slice (wafer), the chip backside, i.e. the second main surface 102b of the CSP semiconductor device 100, may preferably be passivated to reliably avoid the occurrence of electrical short circuits between the contacts on the application circuit and the substrate material 102 of the CSP semiconductor device 100.

Such a backside passivation may be achieved by means of the optional insulation layer applied to the second main surface 102d of the CSP semiconductor device 100.

The subsequent FIGS. 3a-3e, 4a-4b and 5a-5b are exemplary for CSP semiconductor devices having two, three or four contact pads, wherein only the design or form of the exposed contacting regions of the inventive CSP semiconductor device is to be discussed referring to the figures. According to the present invention, it should be noted that these exposed contacting regions will always at least partly occupy at least one side face of the semiconductor device.

Subsequently, preferred embodiments of the inventive CSP semiconductor device having two exposed contacting regions 108a, 108b of the inventive CSP semiconductor device 100 will exemplarily be discussed referring to FIGS. 3a-3e. This embodiment of the inventive CSP semiconductor device exemplarily illustrated may particularly be applied to semiconductor diodes, such as, for example, for the respective cathode and anode terminal of a diode. To simplify the description of the respective designs of the metallization regions 106a, 106b and the exposed contacting regions 108a, 108b, the inventive CSP semiconductor device is only illustrated schematically in FIGS. 3a-3e, i.e. only the semiconductor chip body 102 with the side faces 102c-102f and the metallization regions 106a, 106b are illustrated, wherein otherwise the information made for the CSP semiconductor device illustrated in FIGS. 1a-1b is also to be applied to the semiconductor devices illustrated in FIGS. 3a-3e. In particular, further reference is made to the definition of the main surfaces 102a-102b and side faces 102c-102f schematically illustrated in FIGS. 1a-1b.

Figure 3A:
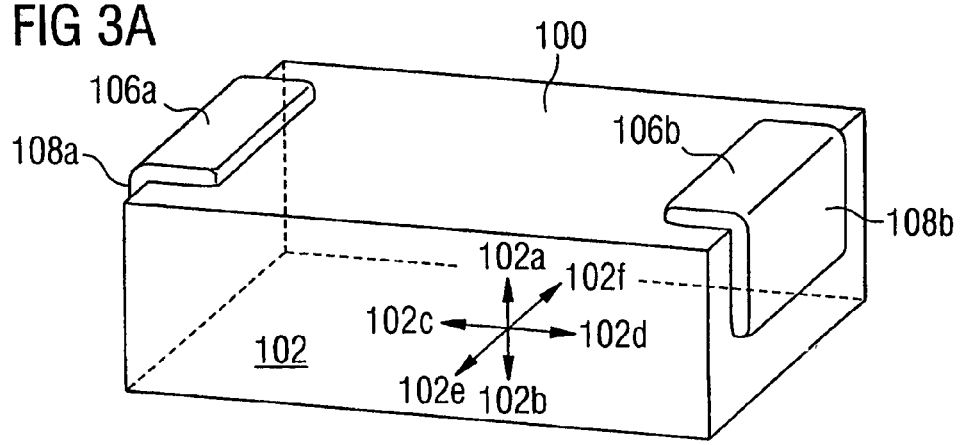
FIGS. 3a-3e show further possible designs of the inventive CSP semiconductor device having two external contact pads.

In the embodiment illustrated in FIG. 3a, the two metallization regions 106a and 106b extend from the first main surface 102a of the semiconductor chip body 102 onto the first side face 102c and the second side face 102d of the semiconductor chip body 102, respectively, wherein the first and second side faces 102c, 102d are only partly covered by the metallization regions 106a, 106b and the metallization regions 106a, 106b do not extend completely on the two side faces from the first main surface 102a to the opposite second main surface 102b. Regarding the arrangement illustrated in FIG. 3a, it should be kept in mind that the metallization regions 106a, 106b need not necessarily extend onto two opposite side faces, but may also be arranged on neighboring side faces. This of course is also true for the other FIGS. 3b-3e.

Figure 3B:
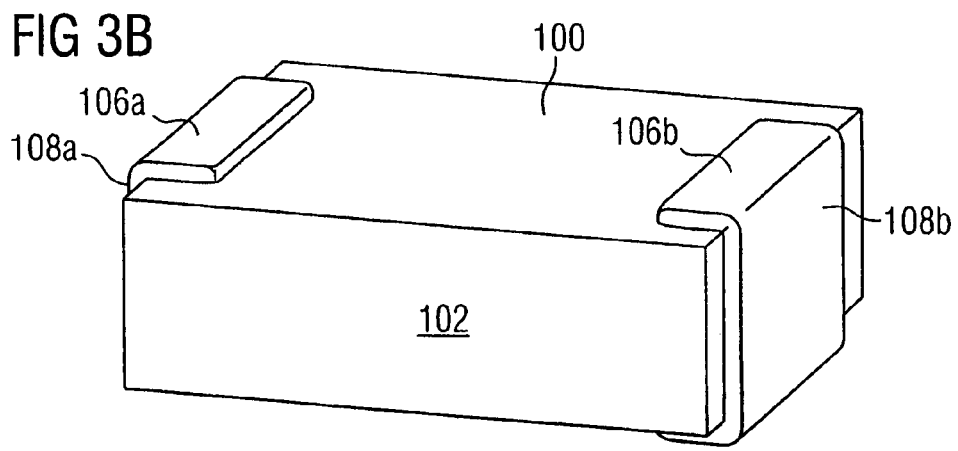

Another possible design of the metallization regions 106a, 106b is illustrated in FIG. 3b, where the metallization regions extend from the first main surface 102a over a respective side face to the opposite second main surface 102b.

Figure 3C:
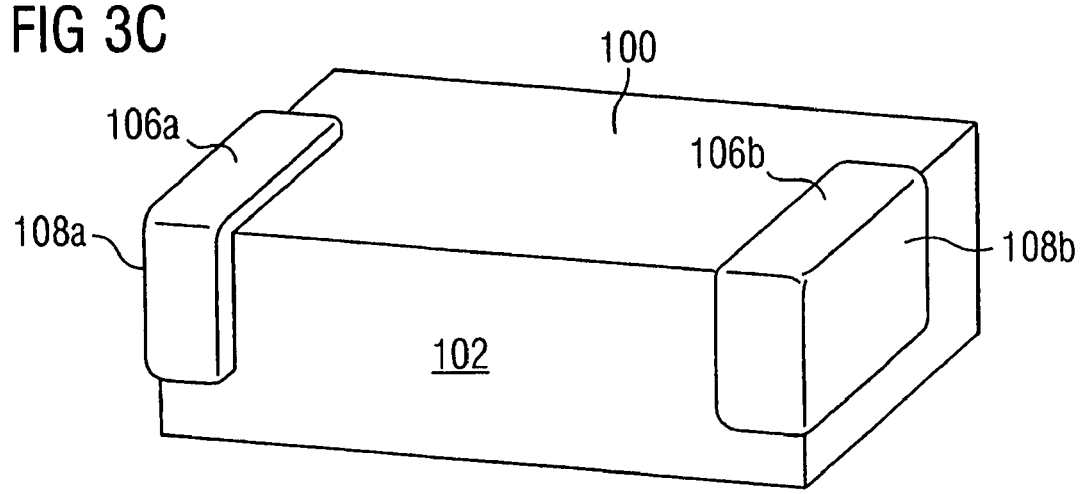

In the arrangement of the metallization regions 106a and 106b illustrated in FIG. 3c, these extend from the first main surface 102a onto two neighboring side faces of the semiconductor chip body, but not completely to the second main surface 102b.

Figure 3D:
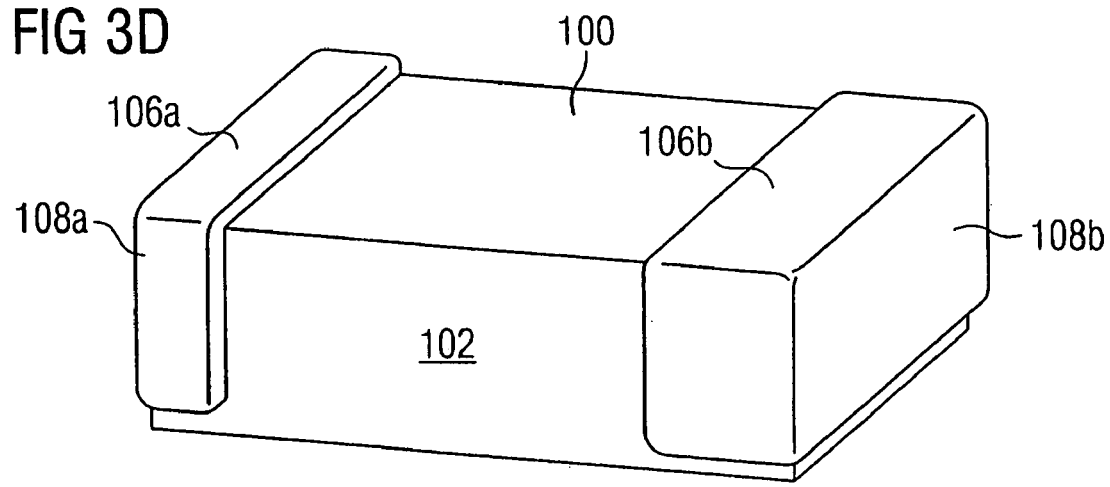

In FIG. 3d, the metallization regions 106a, 106b extend from the first main surface 102a over respective three side faces of the semiconductor chip body, but not completely to the second main surface 102b.

FIG. 3a shows an arrangement of the metallization regions 106a, 106b, where the metallization regions extend from the first main surface 102a of the semiconductor chip body 102 to the opposite second main surface 102b and extend onto the second main surface 102b.

The possible embodiments of the metallization regions of the inventive CSP semiconductor device illustrated in FIGS. 3a-3e show a selection of possible embodiments for the arrangement of the metallization regions, wherein they are to be viewed as non-terminated in the embodiments illustrated in FIGS. 3a-3e. Any embodiment is basically conceivable, where a metallization region extends from the first main surface of the semiconductor chip body over at least one semiconductor chip body edge onto at least one side face of the semiconductor chip body. The exposed contacting regions of the inventive CSP semiconductor device defined by the metallization regions are preferably at fixedly defined positions for the respective semiconductor element or the respective semiconductor device to be able to provide standardized CSP semiconductor devices in this way.

Figure 4A:
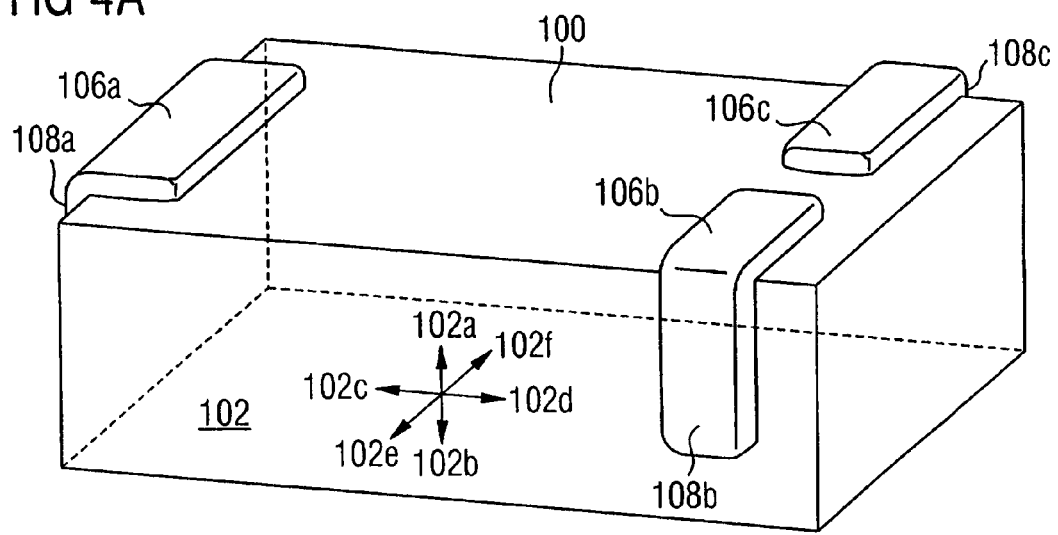
FIGS. 4a-4b show further possible designs of the inventive CSP semiconductor device having three external contact pads.
Figure 4B:
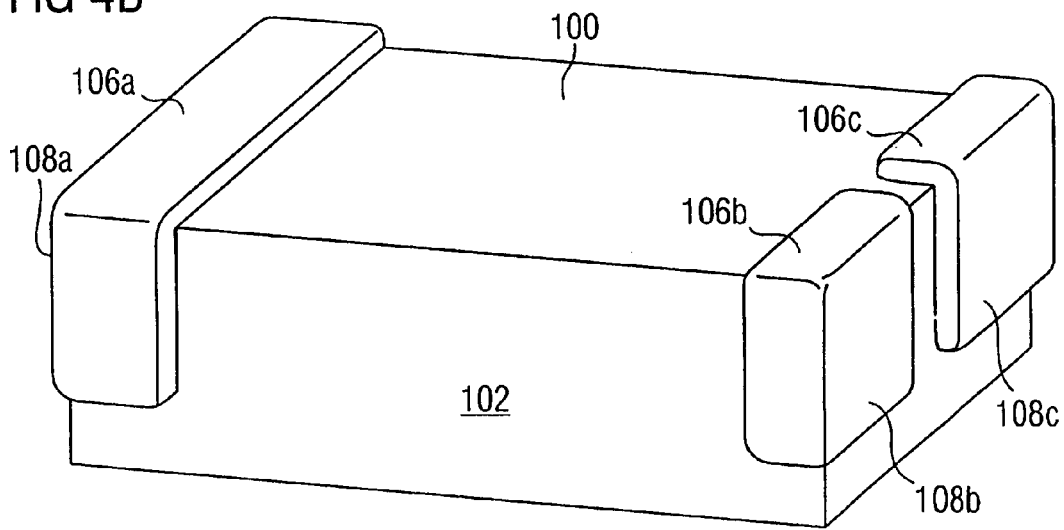

Different possible realizations for inventive CSP semiconductor devices 100 having three metallization regions 106a-106c and correspondingly three exposed contacting regions 108a-108c (designed for triodes), such as, for example, CSP semiconductor devices for transistors having three contact terminals, will be illustrated referring to FIGS. 4a-4b.

As is illustrated in FIG. 4a, a first metallization region 106a extends from the first main surface 102a onto the first side face 102d, wherein the second metallization region 106b extends from the first main surface 102a onto the third side face 102c and the third metallization region 106c extends onto the fourth side face 102f. It is of course also possible with the CSP semiconductor devices 100 having three metallization areas 106a-106c that the single metallization areas 106a-106c also extend onto two or more neighboring side faces of the semiconductor chip body 102, as is exemplarily illustrated in FIG. 4b, wherein it is of course also possible with the CSP semiconductor devices 100 having three metallization regions 106a-c according to the present invention that they additionally also extend onto the opposite second main surface 102b and form the exposed contacting regions 108a-108c.

In all embodiments of the present invention, it is only important with regard to the arrangement of the metallization regions on the surfaces of the semiconductor device that the metallization regions 106a-106c, among one another, do not cause undesired electrical short circuits, wherein this is of course also to be true when the exposed contacting regions 108a-108c are connected to the applications by means of solder.

Figure 5A:
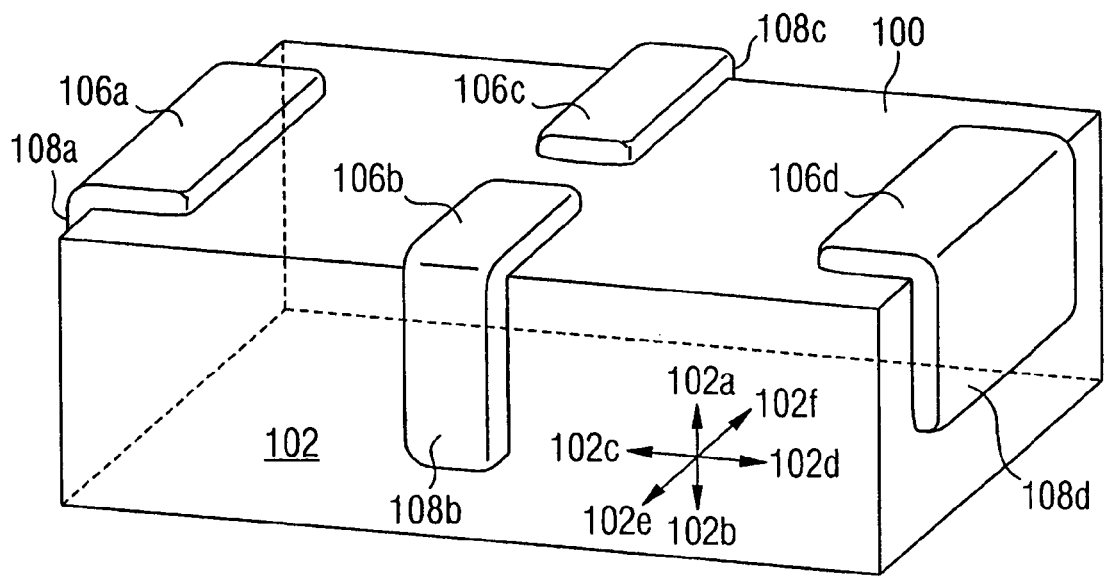
FIGS. 5a-5b show further possible designs of the inventive CSP semiconductor device having four external contact pads.
Figure 5B:
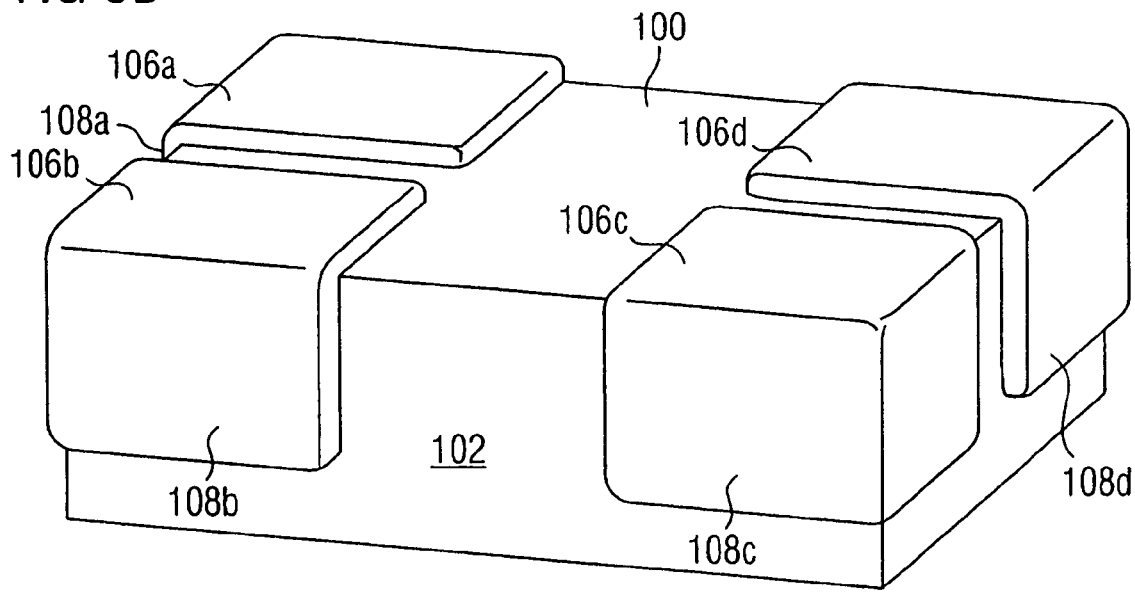

The explanations made before with regard to the metallization regions may of course also be applied to CSP semiconductor devices 100 having four or more metallization regions, wherein FIGS. 5a-5b represent models for the inventive CSP semiconductor devices 100 for tetrodes (CSP semiconductor devices having four contacting regions).

As is illustrated in FIG. 5a, the inventive CSP semiconductor device 100 comprises four metallization regions 106a-106b and correspondingly four exposed metallization contacts 108a-108d, wherein the four metallization regions 106a-106d extend from the first main surface 102a of the semiconductor chip body 102 onto a respective side face 102c-102f of the semiconductor chip body 102.

FIG. 5b illustrates an arrangement of an inventive CSP semiconductor device 100, where each metallization region 106a-106d extends from the first main surface 102a of the semiconductor chip body 102 onto two neighboring side faces, wherein the metallization regions 106a-106d are arranged symmetrically with regard to the corner edges (connecting the side faces 102c-102f to one another) of the semiconductor chip body 102.

Referring to the CSP semiconductor devices illustrated in FIGS. 5a-5b, it is also to be pointed out that these illustrations have only been chosen exemplarily, wherein in the illustrations shown there, too, the metallization regions 106a-106d may extend only partly over the side faces, completely to the second main surface 102b and/or onto the second main surface 102b, and additionally may, for example, also extend over two or three neighboring side faces of the semiconductor chip body 102, to form the four exposed contacting regions 108a-108d.

In summary, it may be stated with regard to the embodiments of the inventive CSP semiconductor devices 100 illustrated above that at least one metallization region extends from the first main surface 102a of the semiconductor chip body 102 over at least one main edge of the semiconductor chip body 102 onto at least one side face of the semiconductor chip body 102 to provide at least one exposed contacting region on the side face of the semiconductor chip body. Preferably, the contacts are disposed at fixedly defined positions for the respective semiconductor element or the respective CSP semiconductor device to obtain standardized CSP semiconductor devices in this way.

In the CSP semiconductor devices having two metallization regions 106a-106b, for example for a semiconductor diode, these are exemplarily disposed on two opposite side faces and preferably on the smaller side faces of the semiconductor chip body (compare FIGS. 3a-3e). Thus, neighboring side faces or the backside of the semiconductor chip body may also be occupied without short circuits occurring between the exposed contacting regions.

For the CSP semiconductor device having three metallization regions 106a-106c (triode), these metallization regions are on all side faces of the semiconductor chip body except for one side face, wherein neighboring side faces or the backside of the semiconductor chip body may also be occupied by metallization regions without short circuits occurring between the metallization regions and the exposed contacting regions.

For the CSP semiconductor device having four metallization regions and four exposed contacting regions 106a-106d (tetrodes), the exposed contacting regions 108a-108d are preferably on the four side faces (see FIG. 5a) or on the four side edges of the semiconductor chip body (see FIG. 5b).

The semiconductor chip body exemplarily comprises a form approximating that of a cuboid and having a side ratio of the front side to the active region of 2:1, wherein it is to become obvious that the inventive CSP semiconductor devices may basically comprise any spatial forms, wherein the preferred embodiments and designs of the semiconductor chip body 102 follow the easiest possible manufacturing step on the wafer level, as will be discussed in greater detail below.

Subsequently, a preferred method and a preferred procedure for manufacturing the semiconductor device 100 having an exposed metallization region arranged on a side face of the semiconductor device will be described referring to FIGS. 6a-6g.

With regard to the subsequent description of the inventive manufacturing method of the semiconductor device 100, it is to be pointed out that in FIGS. 6a-6g describing the manufacturing methods, same elements are again provided with the same reference numerals as in the previous figures, a repeated detailed discussion of these elements and the mode of functioning thereof being omitted.

Figure 6A:
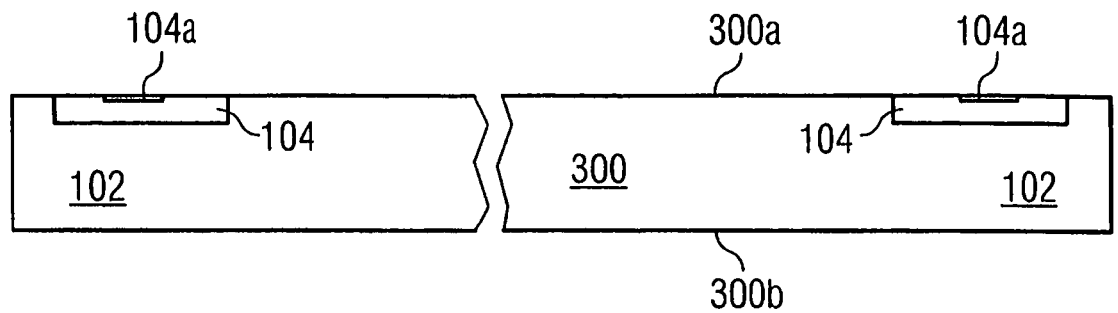
FIGS. 6a-6g show preferred method steps of the inventive manufacturing method for manufacturing a CSP semiconductor device.

As is illustrated in FIG. 6a, a semiconductor wafer 300 having a first main surface 300a and a second main surface 300b is provided at first, wherein a plurality of (active and/or passive) circuit regions 104 are arranged adjacent to the first main surface 300a of the semiconductor wafer 300. To simplify the discussion of the inventive manufacturing method of the semiconductor device 100, only two circuit regions 104 are illustrated referring to the semiconductor wafer illustrated in FIG. 6a, wherein it should, however, become obvious with regard to the present invention that there may be in the order of magnitude of up to $10^6$ active and/or passive circuit regions 104 arranged on a semiconductor wafer which may technically be realized at present.

As is also illustrated in FIG. 6a, every circuit region 104 comprises at least one circuit contact terminal 104a on the first main surface 300a of the semiconductor wafer 300.

Thus, the semiconductor wafer 300 serves as a starting point of the inventive manufacturing method of the semiconductor device 100 which has been obtained by means of standard front side processing steps, wherein in the present case, for example, passivation of the first main surface 300a of the semiconductor wafer 300 has not yet been performed.

Figure 6B:
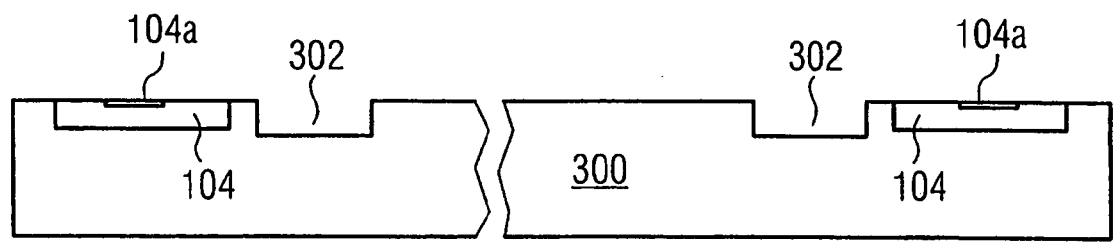

As is now illustrated in FIG. 6b, in an area adjacent to the respective circuit region 104, a trench 302 is produced in the main surface 300a of the semiconductor wafer 300 adjacent to the circuit regions 104. The trenches 302 are usually formed between the single semiconductor chip bodies 102 of the semiconductor devices 100 to be manufactured. As will be discussed subsequently, the side faces of the semiconductor chip body 102 of the semiconductor devices 100 to be manufactured are produced by the trenches 302. The trenches 302 in the first main surface 300a of the semiconductor wafer 300 are preferably produced by conventional semiconductor wafer 300 sawing methods or by laser sawing or by anisotropic etching or by any other suitable method for producing the trenches 302. The depth of the trenches is thus preferably adjusted to the thickness of the semiconductor chip body 102 of the semiconductor device 100 to be obtained, wherein, for example, in conventional single semiconductor devices, a depth of the trenches 302 in the range from 100 to 600 μm and preferably from 200 to 400 μm is preferred. The depth of the trenches 302 may, for example, depend on the depth of the active region 104, such as, for example, of the single semiconductor devices, of the complex integrated circuits, etc. in the semiconductor body 102 and further correspond to the resulting height of the semiconductor devices 100 produced.

Figure 6C:
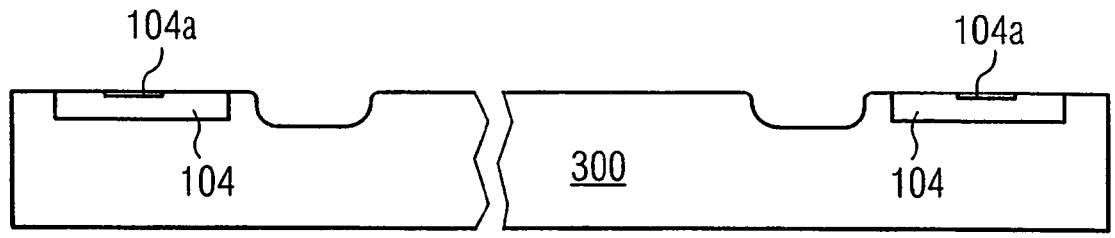

In case an anisotropic etching method is used for producing the trenches 302 in the main surface 300a of the semiconductor wafer 300, optionally so-called over-etching of the trenches 302 may be performed to obtain rounding of the edges of the trenches 302, as is indicated in FIG. 6c. This may, for example, be a simplification in the further processing steps discussed below and thus the further setup of the inventive semiconductor device may frequently be performed more reliably.

The step of etching or the optional step of overetching the trenches 302 may exemplarily be performed with covered active regions 104 to protect them. The rounding of the edges of the trenches 302, for example, allows a simplified deposition of different material structures onto or into the trenches. As will be discussed below, the trenches 302 may subsequently still serves as so-called sawing paths for dicing the single semiconductor devices 100.

Figure 6D:
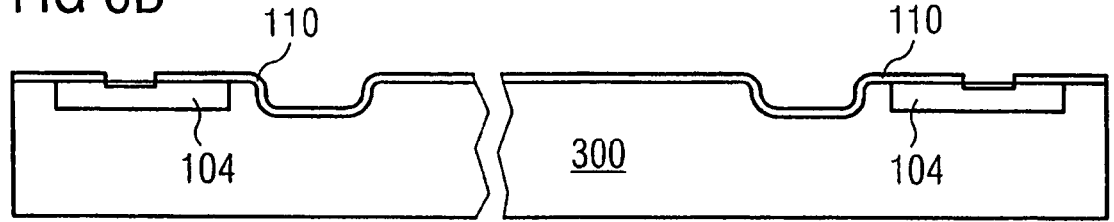

In the further method step illustrated in FIG. 6d, an insulation layer (preferably continuous or contiguous) is produced on the circuit region and at least partly in the trenches 302, wherein the circuit contact regions 104a at least partly remain exposed. In this method step, side face passivation is performed by means of standard methods, such as, for example, oxidation or deposition of the passivating layers.

According to the inventive method of manufacturing semiconductor devices, the following procedures may, for example, be employed for passivating integrated circuits. In order to protect integrated circuits from, for example, corrosion, mechanical damage and external environmental influence, the passivation layer 110 is applied onto the regions to be protected after patterning the first main surface 300a of the semiconductor wafer 300, wherein the passivation layer 110 is usually only opened at those locations where the terminal wires or contactings to the circuit contact terminals of the active circuit regions (pads) are mounted. The passivation layer 110 may, for example, consist of a double layer of plasma oxide and plasma nitride which may each comprise a thickness of, for example, 0.2 to 2.0 μm and preferably 0.5 to 1 μm.

The thickness of the insulation/passivation layer 110 or the insulation/passivation layer stack 110 should, depending on the dimensions and the pattern of the surface to be covered, comprise a sufficient layer thickness to avoid cracks in the passivation layer caused by mechanical tension differences in the layers, by insufficient layer adhesion or by tensions in the semiconductor material. Additionally, the thickness of the passivation layer 110 or the passivation layer stack is to be chosen such that these receive a sufficient electrical breakdown resistance between the metallization layer 106 and the semiconductor material of the semiconductor chip body 102, as will be explained in greater detail below.

Possible realizations of the insulation layer 110 or the insulation layer stack are, according to the present invention, as has already been discussed before referring to FIGS. 1a-1b, to provide a layer of a nitride material (such as, for example, Si3N4) having a thickness in a range around about 600 nm. Alternatively, a layer stack of an oxide material having a thickness in a range around about 550 nm and of a nitride material (such as, for example, Si3N4) having a thickness in a range around about 300 nm may be provided. Optionally, a layer of an imide material having a thickness of about 10 µm or a layer of a BCB material (benzocyclobutene) having a thickness of around 5 µm may be provided additionally onto the insulation layer 110 or the insulation layer stack.

Figure 6E:
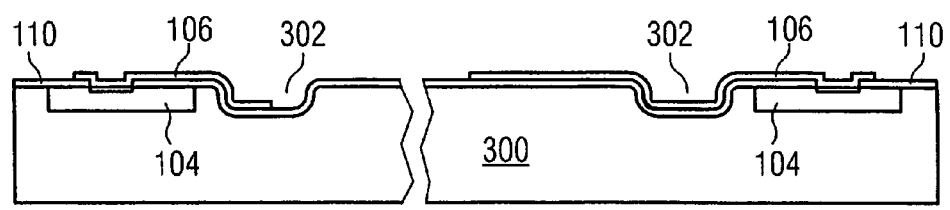

As is shown in FIG. 6e, on the insulation or passivation layer metallization regions 106 are deposited on the insulation layer 110 and the circuit contact region 104a such that the metallization regions 106 are connected to the circuit contact terminals 104a and the metallization regions 106 extend from the circuit contact terminals 104a of the circuit regions 104 at least partially into the adjacent trenches 302. As is illustrated in FIG. 6e, the trenches 302 may be covered partially or covered completely by the metallization regions 106. The metallization regions 106 may be patterned by means of conventional processing steps in order for them to receive the desired form or dimension on the insulation layer 110.

According to the present invention, a so-called metallic seed layer is, for example, (optionally) deposited onto the insulation layer 110 to produce the metallization regions 106, wherein this seed layer is the starting point for an optional galvanic process to be performed subsequently. The seed layer or seed layer regions are, for example, patterned on the first main surface 300a of the semiconductor chip 300 and the side faces of the trenches 302 corresponding to the metallization regions 106 to be obtained subsequently by means of conventional processing steps. By means of a subsequently performed metal galvanic process, a copper layer or an aluminum layer is preferably deposited onto the patterned seed layer or the structured seed layer regions.

A possible realization of a sheet stack for the metallization regions 106 is, according to the invention, to provide a layer of an Al material having a thickness of preferably 0.5 µm as a seed layer and a layer of an Ni material (Ni=nickel) having a thickness of preferably 20 m having an Au cap (Au=gold) having a thickness of preferably a few atomic layers. The metallization regions 106 may, however, also comprise other metal materials, such as, for example, copper (Cu), titanium (Ti), tungsten (W), tin (Sn), silver (AG), etc.

The metallization regions 106 are, as regard dimension and surface characteristics, inventively chosen such that they are suitable for subsequent further processing in the application, for example as standardized contact pads, so that, for example, tinning of the metallization regions 106 is preferable as a final galvanic step. The galvanically deposited metal layers may, according to the invention, cover the side faces of the trenches partially or completely, as the respective model requires, as has exemplarily been illustrated referring to the semiconductor devices in FIGS. 1-5. According to the present invention, the trenches 302 may be filled either partially or completely with the metal layers.

Figure 6F:
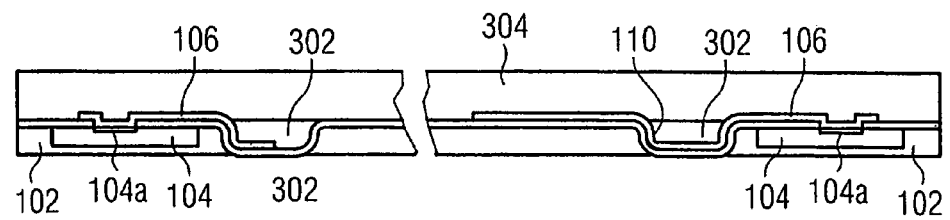

FIG. 6f shows another processing step of the semiconductor wafer 300, wherein optionally a film is applied onto the semiconductor wafer, i.e. on the first main surface 300a of the semiconductor wafer 300, and the semiconductor material of the semiconductor wafer is ground to a predetermined remaining thin thickness of, for example, 0 µm to 300 µm in the trenches. With a trench depth of 100 µm and a final thickness of 400 µm, a remaining thickness of 300 µm seems, for example, to be sensible. With a trench depth of 100 µm and a final thickness of 100 µm, a remaining thickness of 0 µm seems, for example, to be sensible so that it becomes evident that the respective remaining thickness may be adjusted depending on the individual case. The semiconductor wafer is preferably deposited onto the film to be able to handle this processing step and the subsequent processing step more easily.

Optionally, the backside of the thinned semiconductor wafer 300 and thus the second main surface 102b of the semiconductor devices 100 to be produced may be provided with a passivation layer as a protection against corrosion, mechanical damage and external environmental influence. This passivation of the chip backside, i.e. of the second main surface 102b of the CSP semiconductor device 100, is preferably also provided for reliably avoiding electrical short circuits between contacts on an application circuit and the substrate material 102 of the CSP semiconductor device 100. This passivation layer may, for example, consist of a double layer of plasma oxide and plasma nitride which may each comprise a thickness of, for example, 0.2 to 2.0 µm and preferably 0.5 to 1 µm. This additional passivation layer may, of course, also comprise the materials and/or material properties of the optional insulation layer 110 illustrated with respect to FIGS. 1a-b and 2.

In the method step according to the inventive manufacturing method of the semiconductor device 100 illustrated subsequently in FIG. 6g, the semiconductor wafer 300 is diced to obtain a plurality of diced semiconductor devices 100 having the exposed metallization region 106a arranged on one of the side faces of the semiconductor device 100.

For dicing the semiconductor wafer 300, a part of the metal material in the trenches 302 is for example removed according to the present invention to achieve dicing of the semiconductor wafer and thus the single semiconductor devices 100. This may, for example, take place by etching steps, mechanical sawing steps, laser sawing steps or even by CMP steps.

Damage etching of the remaining semiconductor material below the trenches 302 may, for example, be performed for dicing the semiconductor wafer 300. When mechanically thin-grinding the slice, many offsets or damages are produced in one layer on the backside of the semiconductor wafer. This layer having the offsets or damages is etched off in a damage etching process.

The remaining metallization in the trenches 302 of the semiconductor wafer 300 may then be treated by mechanical sawing processes or layer sawing processes or CMP methods (CMP=chemical mechanical polishing), which is how the semiconductor wafer 300 is finally diced and the single semiconductor devices 100 are obtained. For further handling, such as, for example, measuring, housing, etc., of the diced semiconductor devices 100, the film 304 on which, optionally, the semiconductor devices have been during the last processing steps, may be expended to an extent required for further processing and accessibility of the single semiconductor devices 100.

Figure 6G:
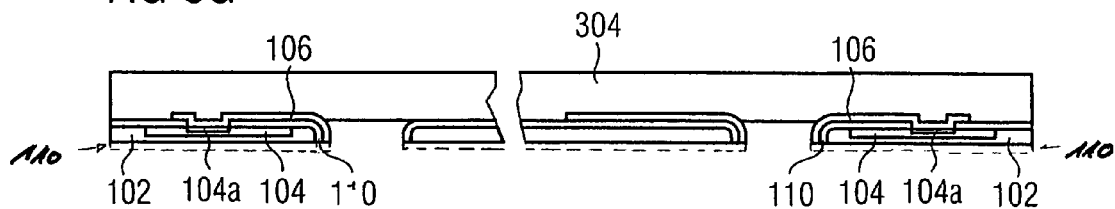

With reference to the procedure for dicing the semiconductor wafer 300 by means of sawing or etching processes illustrated in FIGS. 6f and 6g, it is to be noted that these dicing processes may be problematic in that in a sawing process for dicing for example, ridges may frequently remain on the metallization regions 106, wherein etching of the metallization regions 106 on the side faces of the trenches 302 is often relatively difficult to control in etching processes for dicing.

Subsequently, optional and/or additional method steps of the inventive manufacturing method for producing a CSP semiconductor device 100 will be discussed referring to FIGS. 7a-7e, which may be performed additionally and/or optionally with regard to the method steps illustrated in FIGS. 6f to 6g to counteract the problems mentioned above when dicing the semiconductor wafer 300 by means of sawing or etching processes.

Figure 7A:
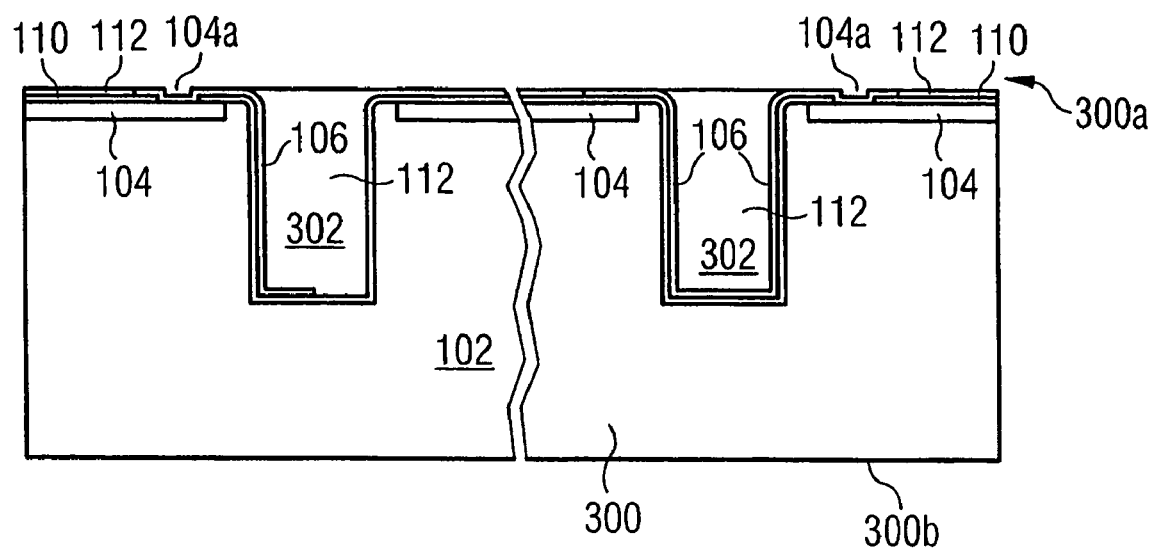
FIGS. 7a-7e show optional additional method steps of the inventive manufacturing method for manufacturing a CSP semiconductor device.

As is illustrated in FIG. 7a, after depositing the metallization regions 106 onto the insulation or passivation layer 110 (method steps of FIG. 6e), an additional protective layer 112 may be deposited which should cover at least the metallization regions 106 on the side faces in the trenches 302, wherein, as is shown in FIG. 7a, the trenches 302 may, for example, be completely filled by the additional protective layer 112. Furthermore, the additional protective layer 112 may, for example, be deposited over the entire first main surface 300a of the semiconductor wafer 300, such that the additional protective layer 112 may also extend over the metallization regions 106 and/or the regions therebetween. This additional protective layer 112 may, for example, be deposited onto the semiconductor wafer 300 and at least into the trenches 302 thereof from a BCB material (benzocyclobutene) by means of standard applying methods. If this additional protective layer 102 also extends over the first main surface 300a of the semiconductor wafer 300, it will be required to grind back or etch back this additional protective layer 112, for example by means of standard methods, such as, for example, CMP processes, such that only the trenches 302 of the semiconductor wafer 300 are filled and the contacting regions 104a on the first main surface 300a of the semiconductor wafer 300 are exposed again for subsequent contacting. Thus, it is of advantage when the additional protective layer 102 remains between the metallization regions 106 and flush adjacent thereto on the first main surface 300a (compare insulation layer 110 and protective layer 112 on the first main surface 102a of the semiconductor chip 100 of FIGS. 1a-1b). This additional protective layer 112 will then be effective to protect the metallization regions 106 on the side faces of the trenches 302 during subsequent dicing steps.

Figure 7B:
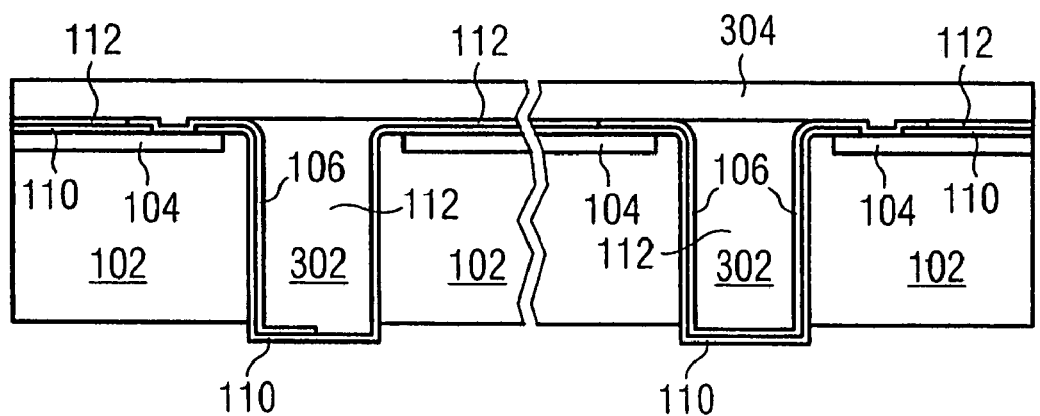
Figure 7C:
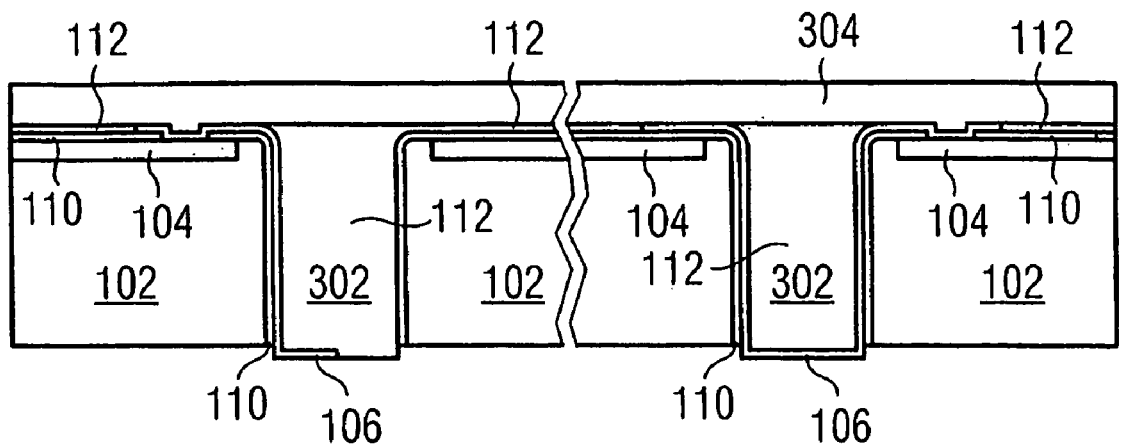
Figure 7D:
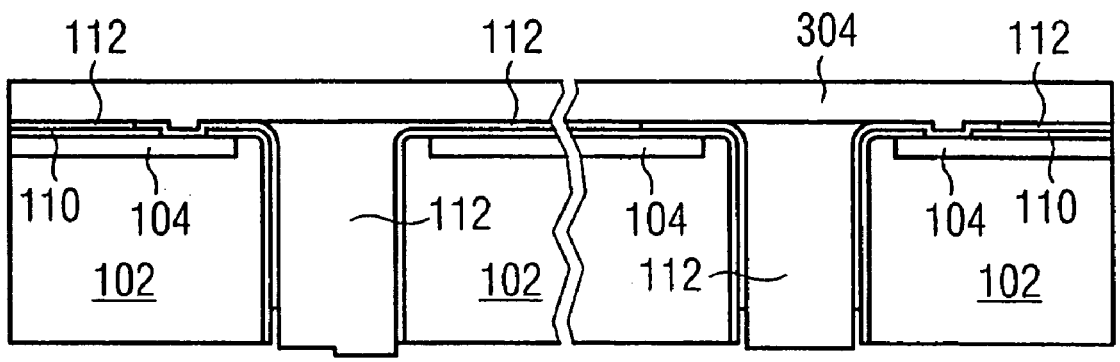

As is illustrated in FIG. 7b as another optional processing step of the semiconductor wafer 300, a film 304 may be applied onto the first main surface 300a of the semiconductor wafer 300, wherein the semiconductor material of the semiconductor wafer 300 on the second main surface 300b thereof may be ground back or etched back to a predetermined remaining thickness of, for example, 0 μm to 300 μm in the trenches (compare the procedure described referring to FIG. 6f). When an etching process is performed when thinning the semiconductor wafer 300 on the second main surface 300b thereof after the grinding process, it can be avoided having to grind down to the metallization regions 106 on the bottom of the trenches 302. Thus, it is also made possible to remove possible offsets which may arise in mechanical grinding processes. The etching processes of the second main surface 300b of the semiconductor wafer 300 discussed are very mild and even curative for the product to be, i.e. the diced semiconductor device 100. As is illustrated in FIG. 7c, the passivation layer 110 when being exposed in the trenches 302 towards the second main surface 300b of the semiconductor wafer 300, may be removed or etched by standard methods, as is illustrated in FIG. 7c.

When necessary, the metallization regions 106 may still be shaped to a desired form by means of standard methods. Thus, it is possible due to the applied additional protective layer 112 in the trenches 302, i.e. with a preferable complete filling of the trenches 302, to remove and etch away the metallization regions 106 not only on the bottom of the trenches 302 but also optionally, in a controlled manner, on the side faces of the trenches 302, i.e. on the side faces of the resulting semiconductor device 100, as is exemplarily illustrated in FIG. 7b.

Thus, it is made possible to suitably adjust a distance d between the second main surface 300b of the diced semiconductor wafer 300 and the metallization regions 106 (compare distance d between the metallization regions 106a-106c and the second main surface 102b of the semiconductor device 100 of FIGS. 1a-1b), such that this distance d allows possible protection from electrical breakdown between the side face metallizations 106 and the backside or second main surface 102b of the semiconductor device 100. This distance d may, depending on the requirements to the electrical breakdown resistance, i.e. depending on the operating voltage requirements, be, for example, in a range from 0 to 200 μm and preferably in a range around about 50 μm.

Of course, it is also possible to apply an optional passivation and/or insulation layer to the second main surface 102b of the semiconductor device 100 so that the second main surface 102d (the backside) of the semiconductor device 100 is at least partially covered by such a passivation and/or insulation layer. This method step of applying the optional insulation layer may be done substantially in any way as part of the processing stages and/or method steps illustrated with respect to FIGS. 6f-g and FIGS. 7b-e, as long as the semiconductor body 102 has already been thinned to its final thickness on the backside.

This optional insulation layer may, for example, advantageously be applied to the second main surface 102b of the semiconductor body 102 during and/or after the processing step of the semiconductor wafer 300 illustrated with respect to FIG. 7b. As illustrated in FIG. 7b, the materials disposed in the trenches 302 protrude beyond the second main surface 102b of the thinned semiconductor body 102 so that these protruding portions may also be easily removed, etched away and/or polished back by suitable methods, such as CMP methods (CMP=chemical mechanical polishing), after applying such an optional passivation and/or insulation layer.

It should be noted that this additional passivation and/or insulation layer may easily still be applied after the processing stages and/or method steps illustrated in the further FIGS. 7b-e.

The materials suitable for this additional, optional passivation and/or insulation layer are substantially again all material components and/or material properties already described above with respect to the (optional) insulation layer 110.

Figure 3E:
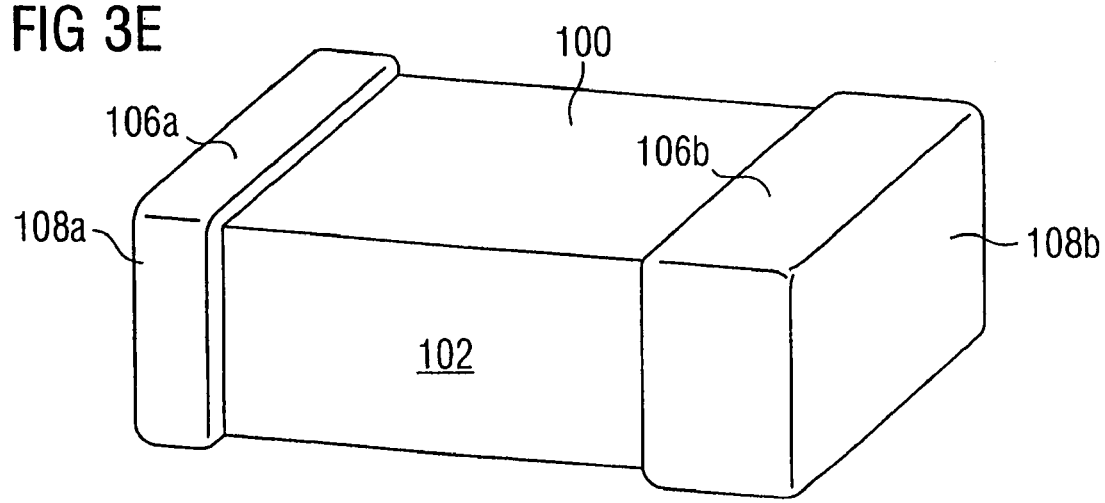
Figure 7E:
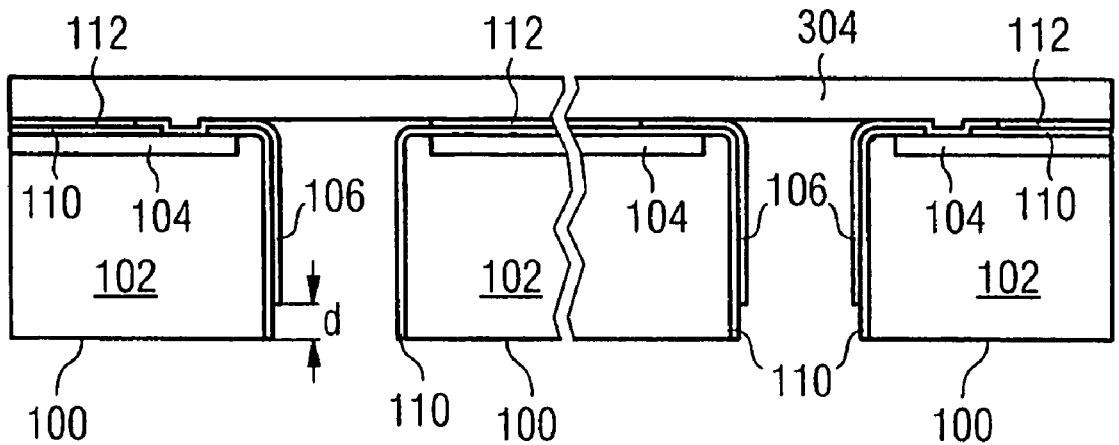

Regarding the procedure for processing and forming the metallization regions 106 illustrated in FIGS. 7c and 7e, it is also to be kept in mind that it is alternatively also possible to remove the portions of the metallization regions 106 on the bottom of the trenches 302 illustrated in FIG. 7c and to produce, after applying an optional insulation layer on the backside of the semiconductor substrate regions 102, a backside metallization connected to the metallization regions 106 to obtain the embodiments exemplarily illustrated in FIGS. 3b and 3e, where the metallization regions extend from the first main surface onto the second main surface (backside) of the semiconductor device.

Finally, as is illustrated in FIG. 7e, the additionally applied optional protective layer 112 or the protective material preferably filling the trenches 302 is removed from the trenches 302 by means of standard methods to obtain the diced semiconductor devices 100. FIG. 7e again shows the (optional)

distance d of the metallization regions 106 from the second main surface of the semiconductor device 100 indicated above.

Regarding the present invention, it is also to be noted that the inventive concept regarding a semiconductor device or the inventive method for manufacturing same may also be applied to such semiconductor elements in semiconductor devices which, for example, comprise a backside contact, such as, for example, a collector, wherein in this case a buried layer having sinker implantations or substrate vias are guided to the front side, i.e. the first main surface 300a of the semiconductor wafer or the semiconductor chip body 102 by well-known procedures and are thus accessible for the inventive metallization regions 106.

Furthermore, it is to be kept in mind with regard to the inventive semiconductor devices 100 that, for example, the entire metallization region 106 may be exposed. Also, it is possible for the metallization region 106 to comprise an additional passivation or protective layer (not shown in the figures) on the main surface 102a of the semiconductor chip body 102, wherein the metallization regions 106, however, still provide an exposed contacting region 108 on the side face of the semiconductor body 102.

The above discussions regarding the inventive manufacturing method of a semiconductor device having an exposed metallization region arranged on a side face of the semiconductor device clarify that the inventive manufacturing method may be performed as a full-wafer process, i.e. the production of complete semiconductor devices 100 which may directly be introduced into applications is possible on the wafer level.

Regarding the inventive CSP semiconductor device 100 discussed above, the manufacturing method thereof and the inventive circuit assembly 200, it may be stated that the exposed contacting regions of the inventive CSP semiconductor device are arranged on the semiconductor chip body in a way only separated from it by an insulation layer or dielectric and are particularly arranged on the side faces of the semiconductor chip body (on the insulation layer 110) of the CSP semiconductor device. Thus, according to the present invention, no additional chip area must be provided for the exposed contacting regions or contact regions for external contacting, as has been necessary in the package forms according to the prior art.

Additionally, the inventive CSP semiconductor device is, with regard to the area of the active circuit region on the semiconductor chip body, not larger than necessary and consequently occupies very little space when being arranged on a circuit board. In addition, the resulting height of the inventive CSP semiconductor device is extremely small, i.e. in the order of magnitude of the semiconductor chip body, wherein the dimensions of a semiconductor device are extremely critical parameters, in particular in circuit modules.

Thus, the inventive semiconductor device having the semiconductor chip body may be designed with such small dimensions which are only predetermined by the area of the (active) circuit region in the semiconductor body. Thus, the material costs necessary for assembling the inventive CSP semiconductor device 100 may be avoided except for one preferably reinforced last metal layer for the metallization regions 106a-106c. Thus, the design suggested according to the present invention for a CSP semiconductor device may be produced considerably cheaper than the package models for semiconductor devices known and available in the prior art.

In addition, it is to be kept in mind with regard to the inventive CSP semiconductor device that assembling the semiconductor chip, which is determined largely by the material costs, frequently is the most expensive manufacturing part of producing single semiconductors. This manufacturing part can be simplified considerably by the inventive CSP semiconductor device. Also, it is of great advantage in the inventive CSP semiconductor device that the terminal contact, i.e. the solder connection between the exposed contacting regions of the semiconductor device and the contact pads on a circuit board, may still be inspected optically after building the inventive CSP semiconductor device into the application since the solder connecting regions are not covered by the inventive CSP semiconductor device. Furthermore, it should be noted with regard to the inventive CSP semiconductor device that, due to the arrangement of the inventive CSP semiconductor device on a circuit board where the second main surface of the semiconductor device rests on the surface of the circuit board, increased reliability and resistance against thermal and/or electrical cycling may be achieved.

With regard to the inventive CSP semiconductor device, it should also be kept in mind that the advantages obtained are most obvious for single semiconductors and high-frequency single semiconductors, wherein the present invention is, however, not limited to those applications but according to the present invention the inventive CSP semiconductor device may basically comprise any number of external exposed contacting regions and may thus also be applied in an advantageous way for integrated circuits.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A semiconductor device comprising:
    a semiconductor body having a first and an opposite second main surface and side faces connecting the main surfaces,
    a circuit region in the semiconductor body adjacent to the first main surface, comprising a circuit contact terminal,
    a metallization region extending from the circuit contact terminal on the first main surface onto a side face of the semiconductor body to provide an exposed contacting region on the side face of the semiconductor body,
    an insulation layer arranged between the metallization region and the semiconductor body, the insulation layer comprising an opening for electrically connecting the circuit contact terminal to the metallization region, and
    wherein the metallization region extends onto at least two neighboring side faces of the semiconductor body.

2. The semiconductor device according to claim 1, wherein the insulation layer extends continuously from the first main surface of the semiconductor body onto one of the side faces of the semiconductor body.

3. The semiconductor device according to claim 1, wherein the metallization region extends onto the opposite second main surface of the semiconductor body.

4. The semiconductor device according to claim 1, wherein the semiconductor device is a diced semiconductor device.

5. The semiconductor device according to claim 1, wherein the entire metallization region is exposed.

6. The semiconductor device according to claim 1, wherein the metallization region comprises a passivation layer on the main surface of the semiconductor body and the metallization region provides an exposed contacting region on the side face of the semiconductor body.

7. The semiconductor device according to claim 1, wherein the circuit region in the semiconductor body comprises a plurality of circuit contact terminals.

8. The semiconductor device according to claim 7, wherein the semiconductor device comprises a plurality of metallization regions extending from the plurality of circuit contact terminals on the first main surface onto at least one side face of the semiconductor body.

9. The semiconductor device according to claim 1, wherein the circuit region comprises a single semiconductor element.

10. The semiconductor device according to claim 1, wherein the circuit region in the semiconductor body comprises a plurality of semiconductor elements.

11. The semiconductor device according to claim 1, wherein the insulation layer comprises at least one selected from the following group of materials: plasma oxide, plasma nitride and imide.

12. The semiconductor device according to claim 1, wherein the insulation layer comprises a thickness of 1 μm to 10 μm.

13. The semiconductor device according to claim 1, wherein the metallization region includes at least one selected from the following group of materials: copper, aluminum, gold, silver, tin, titanium and tungsten.

14. The semiconductor device according to claim 1, wherein the metallization region comprises a thickness of 1 μm to 50 μm.

15. A semiconductor circuit assembly comprising:
a semiconductor device, and
a circuit board having a contact pad,
wherein the semiconductor device comprises a semiconductor body having a first and an opposite second main surface and side faces connecting the main surfaces, a circuit region in the semiconductor body adjacent to the first main surface, comprising at least one circuit contact terminal, a metallization region extending from the circuit contact terminal on the first main surface onto a side face of the semiconductor body to provide an exposed contacting region on the side face of the semiconductor body, and an insulation layer arranged between the metallization region and the semiconductor body,
wherein the insulation region comprises an opening for electrically connecting the circuit contact terminal to the metallization region,
wherein the exposed metallization region on the side face of the semiconductor device is connected to the contact pad of the circuit board by means of an electrical connector and preferably solder, and
wherein the metallization region extends onto two or three neighboring side faces of the semiconductor body.

16. The semiconductor circuit assembly according to claim 15, wherein the semiconductor device rests on the circuit board with the first main surface of the semiconductor body.

17. A semiconductor device, comprising:
a semiconductor body having a first and an opposite second main surface and side faces connecting the main surfaces,
a circuit region in the semiconductor body adjacent to the first main surface, comprising a circuit contact terminal,
a metallization region extending from the circuit contact terminal on the first main surface onto at least one side face of the semiconductor body and not onto the opposite second main surface to provide an exposed contacting region on the side face of the semiconductor body,
an insulation layer arranged between the metallization region and the semiconductor body, the insulation layer comprising an opening for electrically connecting the circuit contact terminal to the metallization region.

18. The semiconductor device according to claim 17, wherein the metallization region extends onto two or three neighboring side faces of the semiconductor body.

* * * * *